US010734956B1

(12) United States Patent
Aude et al.

(10) Patent No.: US 10,734,956 B1
(45) Date of Patent: Aug. 4, 2020

(54) SIGNAL DETECTION CIRCUIT

(71) Applicant: TEXAS INSTRUMENTS INCORPORATED, Dallas, TX (US)

(72) Inventors: Arlo James Aude, Lawrenceville, GA (US); Eleazar Walter Kenyon, Tucker, GA (US); Kumar Anurag Shrivastava, Bengaluru (IN)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 16/675,779

(22) Filed: Nov. 6, 2019

(51) Int. Cl.
| H03F 3/45 | (2006.01) |
| H03K 5/24 | (2006.01) |
| H04B 1/16 | (2006.01) |
| H03K 3/037 | (2006.01) |
| H04B 1/04 | (2006.01) |

(52) U.S. Cl.
CPC ......... *H03F 3/45273* (2013.01); *H03K 3/037* (2013.01); *H03K 5/2472* (2013.01); *H04B 1/16* (2013.01); *H04B 1/04* (2013.01)

(58) Field of Classification Search
CPC .................... H03K 5/24; H03K 5/2472; H03F 3/45179–45273
See application file for complete search history.

(56) References Cited

U.S. PATENT DOCUMENTS

| 6,836,156 | B2 * | 12/2004 | Chien | .................... G01R 19/04 327/58 |
| 7,224,191 | B1 * | 5/2007 | Wang | .................... G01R 19/04 327/60 |
| 7,701,259 | B2 * | 4/2010 | Pan | ...................... H03F 3/45179 327/563 |
| 8,760,196 | B2 * | 6/2014 | Liu | ...................... H03F 3/45179 327/65 |
| 8,854,028 | B2 * | 10/2014 | Lin | .................... H03K 19/0175 323/315 |
| 10,263,759 | B2 * | 4/2019 | Wang | ........................ H04L 5/22 |
| 10,432,432 | B1 * | 10/2019 | Liu | ................... H04L 25/03057 |
| 10,594,285 | B1 * | 3/2020 | Delshadpour | ....... H04L 25/0272 |

OTHER PUBLICATIONS

Meyer, Robert G. "Low-Power Monolithic RF Peak Detector Analysis." Brief Papers, IEEE Journal of Solid-State Circuits, vol. 30, No. 1, Jan. 1995, pp. 65-67.

* cited by examiner

*Primary Examiner* — Thomas J. Hiltunen
(74) *Attorney, Agent, or Firm* — John R. Pessetto; Charles A. Brill; Frank D. Cimino

(57) ABSTRACT

A signal detection circuit includes a signal input terminal, a rectifier circuit, a comparator circuit; a current source, and a comparator output terminal. The rectifier circuit is coupled to the signal input terminal and is configured to receive an input signal and generate a rectified signal based on the input signal. The comparator circuit is coupled to the rectifier circuit and is configured to receive a common mode signal and to generate a difference current based on a difference of the common mode signal and the rectified signal. The current source is coupled to the comparator circuit and is configured to generate a reference current. The comparator output terminal is configured to provide an output signal based on a difference of the reference current and the difference current.

20 Claims, 7 Drawing Sheets

SIGNAL DETECTION CIRCUIT

BACKGROUND

To reduce power consumption, some electronic systems power down various sub-systems at times that the sub-systems are not needed. Such systems monitor operational conditions to determine whether a particular sub-system is needed and should be powered up. For example, a communication sub-system may be powered down when no communications have been received for a predetermined time. While the communication sub-system is powered down, the system monitors a communication medium for indications of attempted communication and powers up the communication sub-system if an attempted communication is identified.

SUMMARY

Signal detection circuits with reduced complexity and power consumption (e.g., less than 25 microamperes) are disclosed herein. In one example, a signal detection circuit includes a signal input terminal, a common mode input terminal, a comparator output terminal, a signal input transistor, a resistor, a capacitor, a common mode input transistor, a current mirror circuit, and a current source. The signal input transistor includes a first terminal coupled to the signal input terminal, and a second terminal coupled to a reference voltage source. The resistor includes a first terminal coupled to a third terminal of the signal input transistor. The capacitor includes a first terminal coupled to the first terminal of the resistor, and a second terminal coupled to the reference voltage source. The common mode input transistor includes a first terminal coupled to the common mode input terminal, and a second terminal coupled to the reference voltage source. The current mirror circuit includes a first transistor and a second transistor. The first transistor includes a first terminal coupled to a second terminal of the resistor, and a second terminal coupled to a third terminal of the first transistor. The second transistor includes a first terminal coupled to a third terminal of the common mode input transistor, and a second terminal coupled to the second terminal of the first transistor. The current source includes a transistor. The transistor of the current source includes a first terminal coupled to a power rail, and a second terminal coupled to a third terminal of the second transistor of the current mirror circuit and the comparator output terminal.

In another example, a signal detection circuit includes a signal input terminal, a rectifier circuit, a comparator circuit; a current source, and a comparator output terminal. The rectifier circuit is coupled to the signal input terminal, and is configured to receive an input signal and generate a rectified signal based on the input signal. The comparator circuit is coupled to the rectifier circuit, and is configured to receive a common mode signal and to generate a difference current based on a difference of the common mode signal and the rectified signal. The current source is coupled to the comparator circuit, and is configured to generate a reference current. The comparator output terminal is configured to provide an output signal indicating detection of a signal at the signal input terminal based on a difference of the reference current and the difference current.

In a further example, a communication circuit includes a wake-up circuit configured to monitor a communication medium for signals. The wake-up circuit includes a signal detection circuit. The signal detection circuit includes a signal input terminal, a common mode input terminal, a comparator output terminal, a signal input transistor, a resistor, a capacitor, a common mode input transistor, a first current mirror circuit, a second current mirror circuit, and a current source. The signal input transistor includes a first terminal coupled to the signal input terminal, and a second terminal coupled to a reference voltage source. The resistor includes a first terminal coupled to a third terminal of the signal input transistor. The capacitor includes a first terminal coupled to the first terminal of the resistor, and a second terminal coupled to the reference voltage source. The common mode input transistor includes a first terminal coupled to the common mode input terminal, and a second terminal coupled to the reference voltage source. The first current mirror circuit includes a first transistor and a second transistor. The first transistor includes a first terminal coupled to a second terminal of the resistor, and a second terminal coupled to a third terminal of the first transistor. The second transistor includes a first terminal coupled to a third terminal of the common mode input transistor, and a second terminal coupled to the second terminal of the first transistor. The second current mirror circuit includes a first transistor and a second transistor. The first transistor of the second current mirror circuit includes a first terminal coupled to the second terminal of the first transistor of the first current mirror circuit, and a second terminal coupled to a third terminal of the first transistor of the second current mirror circuit. The second transistor of the second current mirror circuit includes a first terminal coupled to a third terminal of the second transistor of the first current mirror circuit, and a second terminal coupled to the second terminal of the first transistor of the second current mirror circuit. The current source includes a transistor. The transistor of the current source includes a first terminal coupled to a power rail, and a second terminal coupled to a third terminal of the second transistor of the second current mirror circuit and the comparator output terminal.

BRIEF DESCRIPTION OF THE DRAWINGS

For a detailed description of various examples, reference will now be made to the accompanying drawings in which.

DETAILED DESCRIPTION

In this description, the term "couple" or "couples" means either an indirect or direct wired or wireless connection. Thus, if a first device couples to a second device, that connection may be through a direct connection or through an indirect connection via other devices and connections. Also, in this description, the recitation "based on" means "based at least in part on." Therefore, if X is based on Y, then X may be a function of Y and any number of other factors.

In a communication circuit, while circuits needed to perform communication are powered down, a signal detection circuit monitors a communication medium to identify communication signals. The circuits needed to perform communication, such as receiver circuits, are powered up responsive to detection of communication signals by the signal detection circuit. Some signal detection circuits use large, complex comparator circuits to identify communication signals. Such comparators can consume too much power to be of use in low-power signal detection circuits.

The signal detection circuits disclosed herein feature reduced power consumption and reduced circuit area for use in low-power applications. The signal detection circuits use a simple single-ended one stage current domain comparator that provides high gain and low offset for very low power consumption. Differential implementations of the signal detection circuits provide twice the gain of other architectures.

Figure 1:
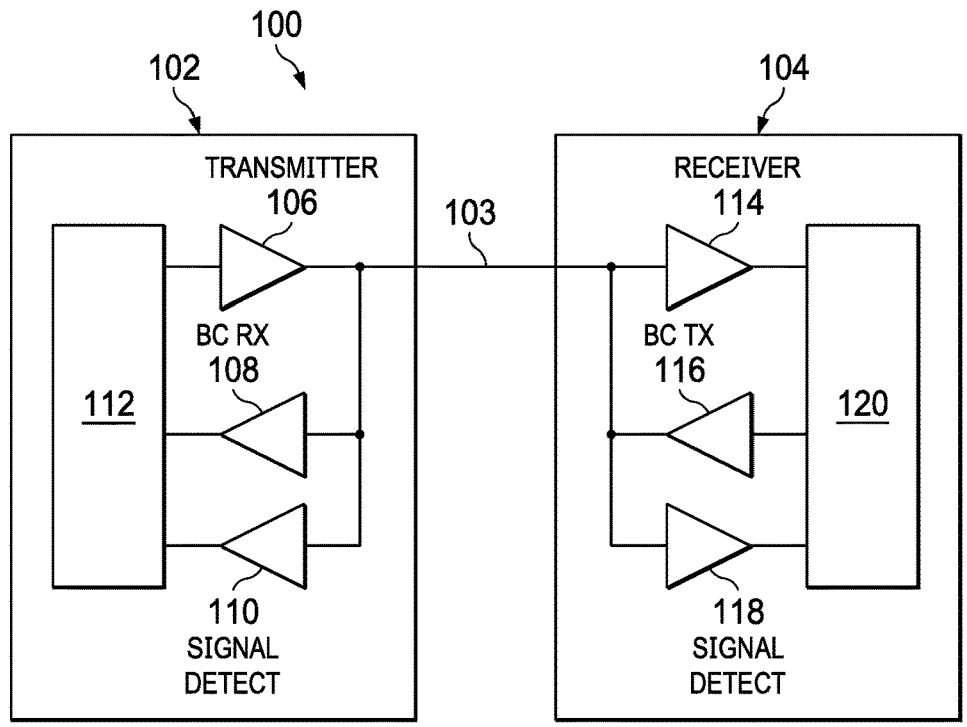
FIG. 1 shows a block diagram of a system that includes signal detection circuits in accordance with this description.

FIG. 1 shows a block diagram of a system 100 that includes signal detection circuits in accordance with this description. The system 100 includes a transmitter circuit 102 and a receiver circuit 104 that communicate via the medium 103. The medium 103 is a coaxial or twisted wire pair cable in some implementations of the system 100. The transmitter circuit 102 includes a forward channel transmitter 106, a back channel receiver 108, and a signal detection circuit 110. The forward channel transmitter 106, the back channel receiver 108, and the signal detection circuit 110 are coupled to the medium 103 and to control circuitry 112. The receiver circuit 104 includes a forward channel receiver 114, a back channel transmitter 116, and signal detection circuit 118. The forward channel receiver 114, the back channel transmitter 116, and the signal detection circuit 118 are coupled to the medium 103 and to control circuitry 120.

To reduce power consumption in the transmitter circuit 102, the forward channel transmitter 106, the back channel receiver 108, portions of the control circuitry 112, and other circuitry of the transmitter circuit 102 may be powered down, while the signal detection circuit 110 remains powered to monitor the medium 103 for back channel transmissions. When the signal detection circuit 110 detects a back channel transmission (e.g., detects transitions on the medium 103), the signal detection circuit 110 signals the control circuitry 112, and in turn, the control circuitry 112 powers up the back channel receiver 108, or the back channel receiver 108 and the forward channel transmitter 106, to communicate with the receiver circuit 104.

Similarly, to reduce power consumption in the receiver circuit 104, the forward channel receiver 114, the back channel transmitter 116, portions of the control circuitry 120, and other circuitry of the receiver circuit 104 may be powered down, while the signal detection circuit 118 remains powered to monitor the medium 103 for forward channel transmissions. When the signal detection circuit 118 detects a forward channel transmission (e.g., detects transitions on the medium 103), the signal detection circuit 118 signals the control circuitry 120, and in turn, the control circuitry 120 powers up the forward channel receiver 114, or the forward channel receiver 114 and the back channel transmitter 116, to communicate with the transmitter circuit 102.

Figure 2:
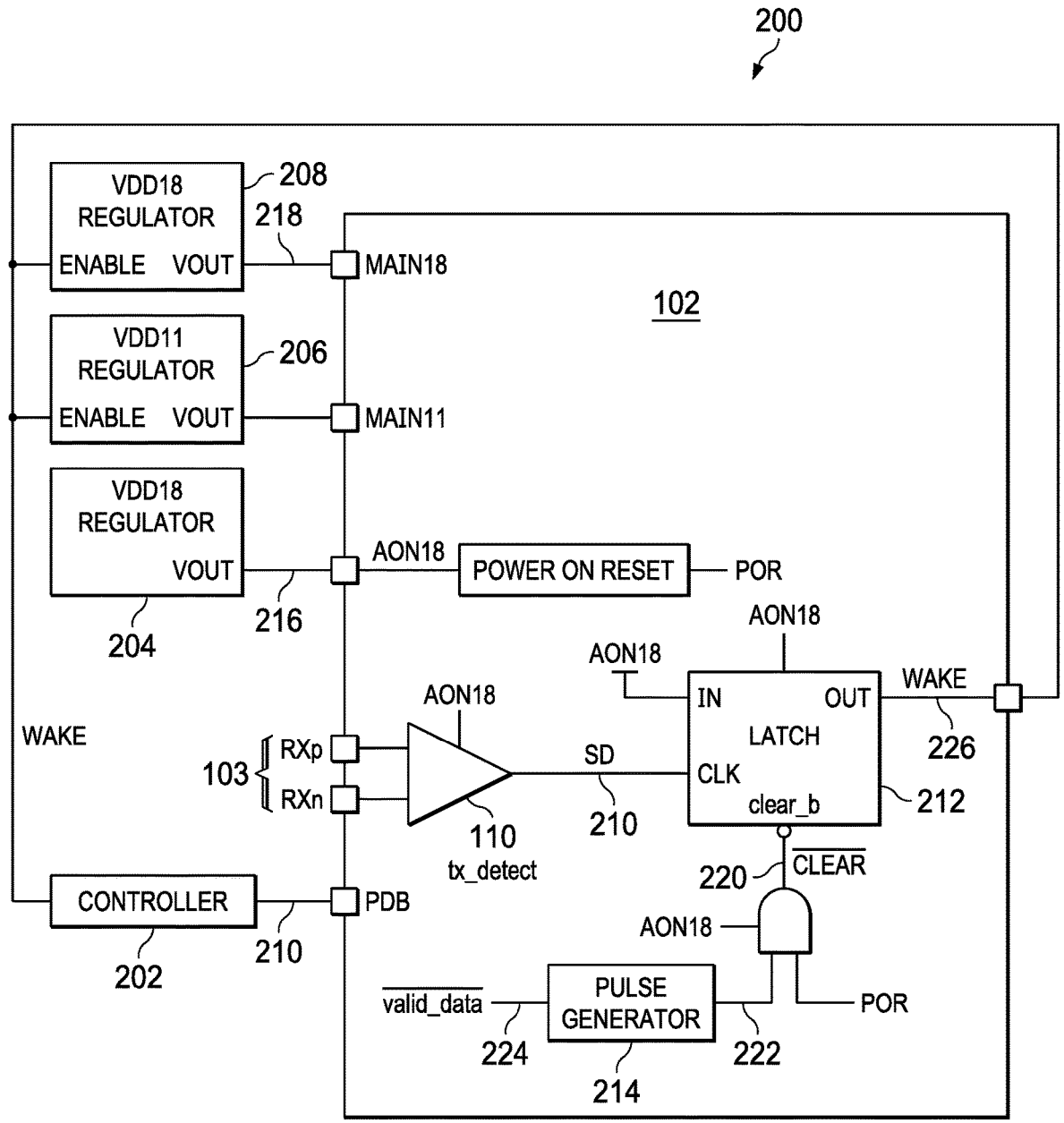
FIG. 2 shows a block diagram for a communication circuit that includes a signal detection circuit in accordance with this description.

FIG. 2 shows a communication circuit 200, which includes a portion of the transmitter circuit 102. The transmitter circuit 102 is coupled to controller 202 and voltage regulators 204, 206, and 208. The controller 202 activates and deactivates the output signal 210 to cause the transmitter circuit 102 to enter and exit a low power state. The regulators 204, 206 and 208 provide power for operation of the transmitter circuit 102. While in a low power state, the regulator 204 provides power for operation of the wake-up circuit 201. The regulator 206 and the regulator 208 provide power for operation of other circuitry of the transmitter circuit 102, and are disabled while the transmitter circuit 102 is in a low power state.

The wake-up circuit 201 includes the signal detection circuit 110, which monitors the medium 103, and activates an output signal 210 when signal is detected on the medium 103. Activation of the output signal 210 sets the latch 212, the output of which enables the regulators 206 and 208, and notifies the controller 202 of the need to enable communication. The controller 202 deactivates the output signal 210, which allows the signal detection circuit 110 to exit the low power state. When the transmitter circuit 102 is operating in a normal power state (i.e., not low power state), the latch 212 remains set while data is present on the medium 103. When no transmissions are present on the medium 103, the pulse generator circuit 214 produces a pulse to reset to the latch 212 thereby disabling the regulators 206 and 208, and notifying the controller 202 that the transmitter circuit 102 may be placed in a low power state to reduce power consumption.

Figure 3:
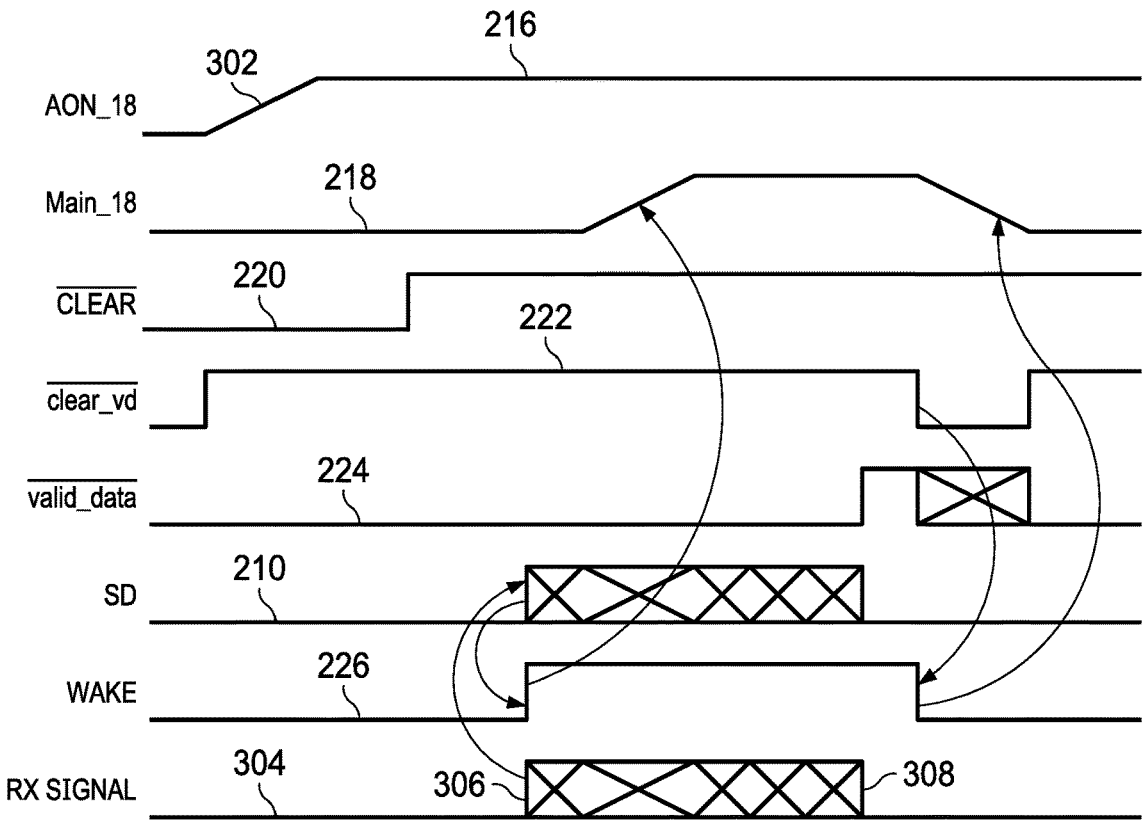
FIG. 3 shows signals generated by operation of the communication circuit of FIG. 2.

FIG. 3 shows signals generated by operation of the communication circuit 200. At 302, the regulator 204 is powered to provide voltage 216 for powering the signal detection circuit 110. The regulators 206 and 208 are disabled. At 306, transmissions are present on the medium 103. The signal detection circuit 110 detects the transmissions and toggles the output signal 210 to set the latch 212 and activate the signal 226. The regulator 206 and the regulator 208 are enabled, responsive to activation of the signal 226.

At 308, transitions on the medium 103 cease and the valid_data_n signal 224 is deactivated, which causes the pulse generator circuit 214 to produce a pulse 222 that resets the latch 212 and deactivates the signal 226. Deactivation of the signal 226 disables the regulators 206 and 208, and notifies the controller 202 of the absence of communication, allowing the controller 202 to return the transmitter circuit 102 to a low power state.

Figure 4:
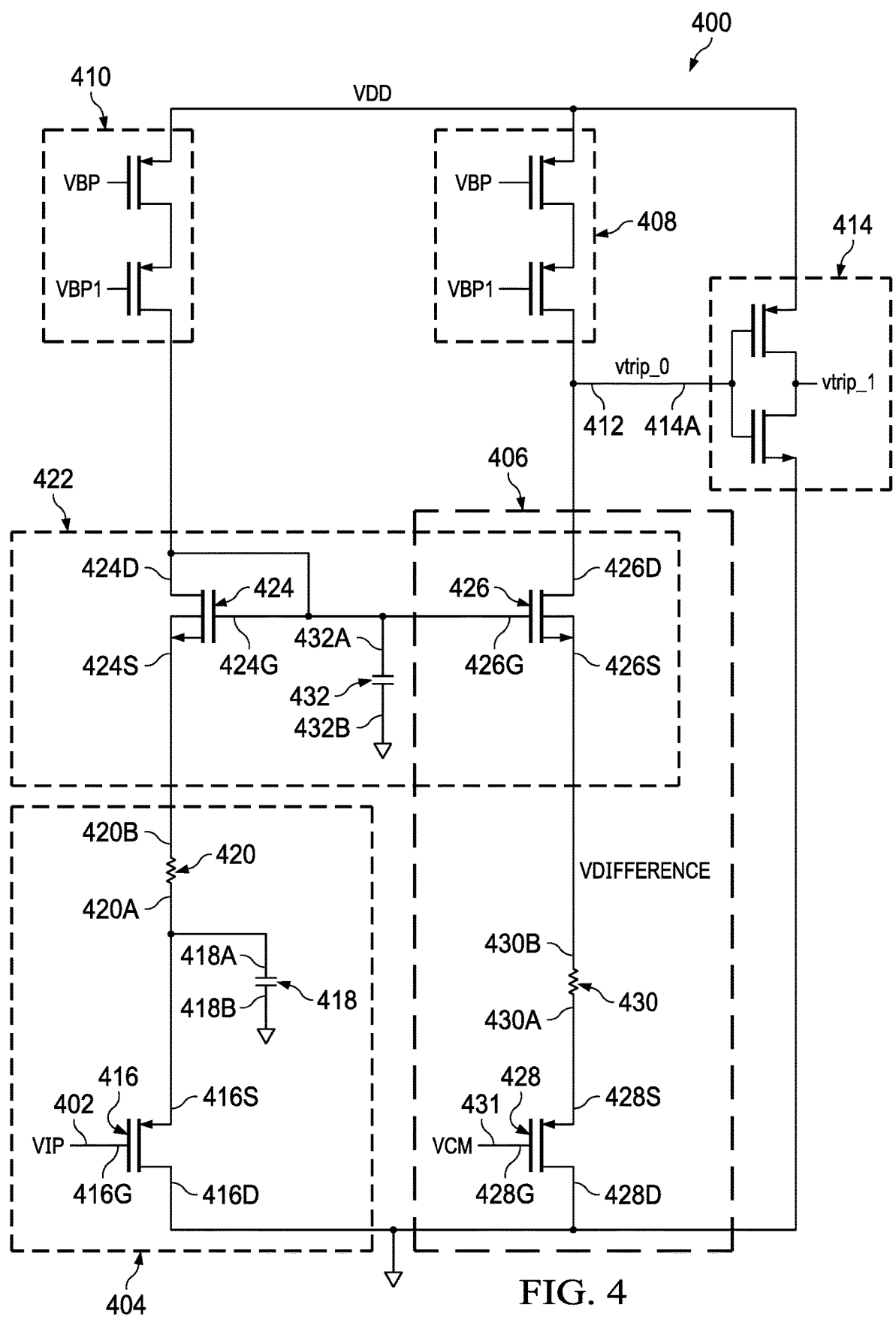
FIG. 4 shows a schematic diagram for an example single-ended signal detection circuit in accordance with this description.

FIG. 4 shows a schematic diagram for an example signal detection circuit 400 in accordance with this description. The signal detection circuit is an implementation of the signal detection circuit 110 or the signal detection circuit 118. The signal detection circuit 400 includes a signal input terminal 402 for detection of a single-ended signal, a rectifier circuit 404, a comparator circuit 406, a current source 408, a current source 410, a comparator output terminal 412, an inverter 414, and a current mirror circuit 422. The rectifier circuit 404 is coupled to the signal input terminal 402. The rectifier circuit 404 receives an input signal and generates a rectified signal based on the received input signal. The rectifier circuit 404 includes a signal input transistor 416, a capacitor 418, and a resistor 420. The signal input transistor 416 receives input signal provided at the signal input terminal 402. A gate terminal 416G of the signal input transistor 416 is coupled to the signal input terminal 402. A drain terminal 416D of the signal input transistor 416 is coupled to a reference voltage source 436, such as ground. A source terminal 416S of the signal input transistor 416 is coupled to a terminal 418A of the capacitor 418 and a terminal 420A of the resistor 420. A terminal 418B of the capacitor 418 is coupled to the reference voltage source.

Signal on the signal input terminal 402 turns on the signal input transistor 416 to discharge the capacitor 418. Thus, the voltage across the capacitor 418 is a function of the signal at the signal input terminal 402.

The current source 410 provides current to charge the capacitor 418 via the current mirror circuit 422. The current source 410 includes a transistor 411. A source terminal 411S of the transistor 411 is coupled to the power rail 434. A drain terminal 411D of the transistor 411 is coupled to the drain terminal 424D of the transistor 424. The current mirror circuit 422 includes a transistor 424 and a transistor 426. The transistor 424 is diode connected. A source terminal 424S of the transistor 424 is coupled to a terminal 420B of the resistor 420. A drain terminal 424D of the transistor 424 is coupled to the current source 410 and to the gate terminal 424G of the transistor 424. The 424G of the transistor 424 is coupled to the gate terminal 426G of the transistor 426, and to a terminal 432A of the capacitor 432. A terminal 432B of the capacitor 432 is coupled to the reference voltage source. The comparator circuit 406 is coupled to the rectifier circuit 404 via the current mirror circuit 422. Current flowing in the rectifier circuit 404 is reflected in the comparator circuit 406 via the current mirror circuit 422.

The comparator circuit 406 includes a common mode input transistor 428 and a resistor 430. Some implementations of the comparator circuit 406 omit the resistor 430.

The comparator circuit 406 receives a common mode signal, generates a difference voltage as a difference of the common mode voltage and the rectified signal provided by the rectifier circuit 404, and generates a difference current based on the difference voltage. A gate terminal 428G of the common mode input transistor 428 is coupled to a common mode input terminal 431. The voltage at the common mode input terminal 431 is an average of the input signal voltage at the signal input terminal 402. A drain terminal 428D of the common mode input transistor 428 is coupled to the reference voltage source. The source terminal 428S of the common mode input transistor 428 is coupled to the source terminal 426S of the transistor 426 via the resistor 430. The source terminal 428S of the common mode input transistor 428 is coupled to a terminal 430A of the resistor 430. A terminal 430B of the resistor 430 is coupled to the source terminal of the 426S of the transistor 426.

The current source 408 provides a reference current to the comparator circuit 406 via the transistor 426 of the current mirror circuit 422. The current source 408 includes a transistor 409. A source terminal 409S of the transistor 409 is coupled to the power rail 434. A drain terminal 409D of the transistor 409 is coupled to the drain terminal 426D of the transistor 426 and to the comparator output terminal 412. The current at the comparator output terminal 412 is a difference of the reference current and the difference current generated in the comparator circuit 406. The inverter 414 (input terminal inverter 414A of the inverter 414) is coupled to the comparator output terminal 412. Voltage at the comparator output terminal 412 is a function of the difference in the common mode voltage and the reference voltage. As the difference increases, the voltage at the comparator output terminal 412 exceeds the threshold of the inverter 414, and the output of the inverter 414 is pulled to ground indicating that a signal has been detected at the signal input terminal 402.

Figure 5:
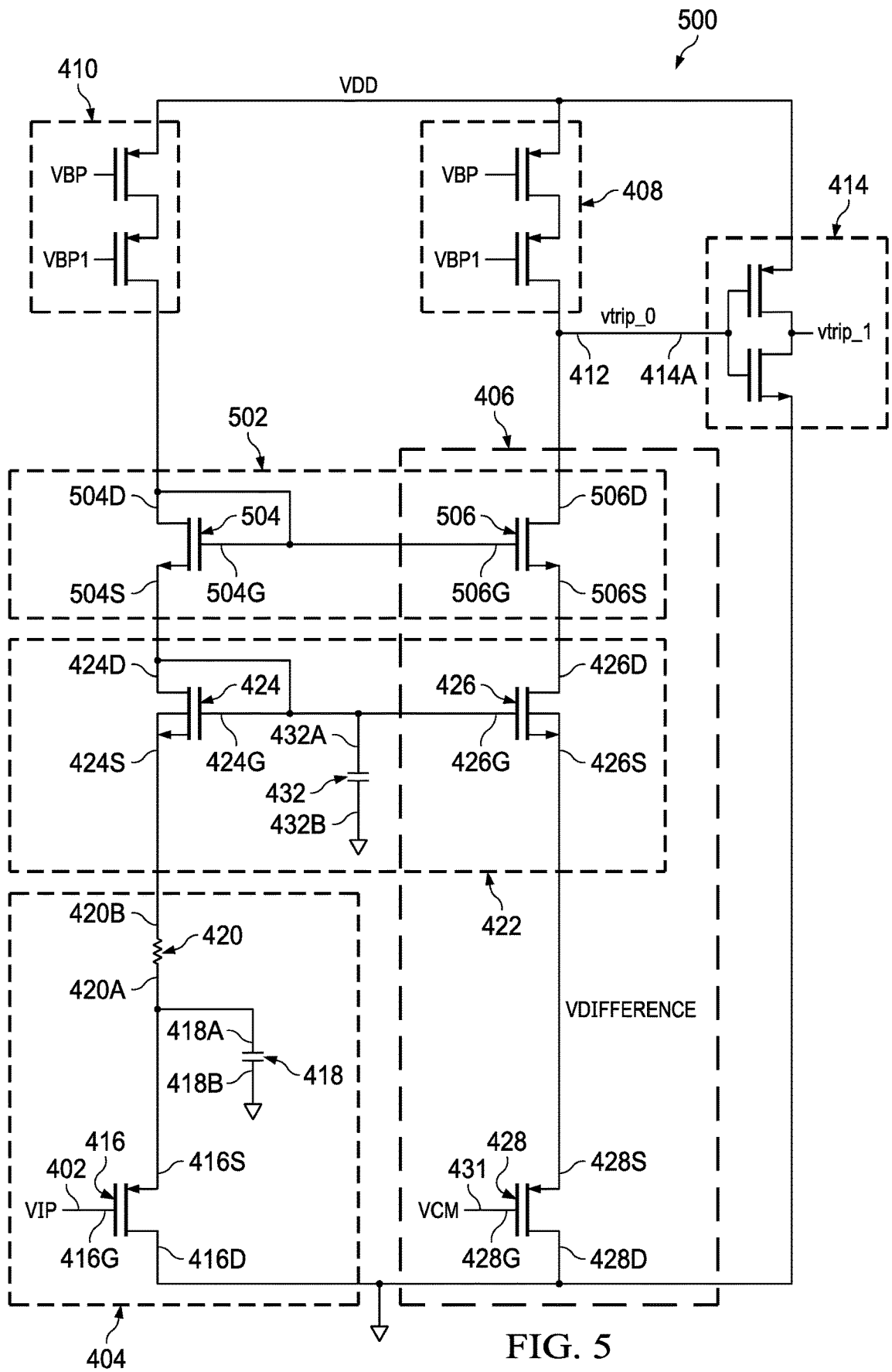
FIG. 5 shows a schematic diagram for another example single-ended signal detection circuit in accordance with this description.

FIG. 5 shows a schematic diagram for an example signal detection circuit 500 in accordance with this description. The signal detection circuit 500 is similar to the signal detection circuit 400, and includes a cascode current mirror circuit 502. The cascode current mirror circuit 502 improves the performance of the signal detection circuit 500 over process, voltage, and temperature to reduce variation in trip point (e.g., by a factor of 3 or more with respect to the signal detection circuit 400). The cascode current mirror circuit 502 includes a transistor 504 and a transistor 506. The transistor 504 is diode connected. A source terminal 504S of the transistor 504 is coupled to a drain terminal 424D of the transistor 424. A drain terminal 504D of the transistor 504 is coupled to the current source 410 and to the gate terminal 504G of the transistor 504. The 504G of the transistor 504 is coupled to the gate terminal 506G of the transistor 506. The source terminal 506S of the transistor 506 is coupled to the drain terminal 426D of the transistor 426. The drain terminal 506D of the transistor 506 is coupled to the current source 408 and the comparator output terminal 412. Current flowing in the rectifier circuit 404 is reflected in the comparator circuit 406 via the cascode current mirror circuit 502.

The signal detection circuit 500 is illustrated as omitting the resistor 430, which further reduces variation of trip point over voltage, process, and temperature. Some implementations of the signal detection circuit 500 include the resistor 430.

Figure 6:
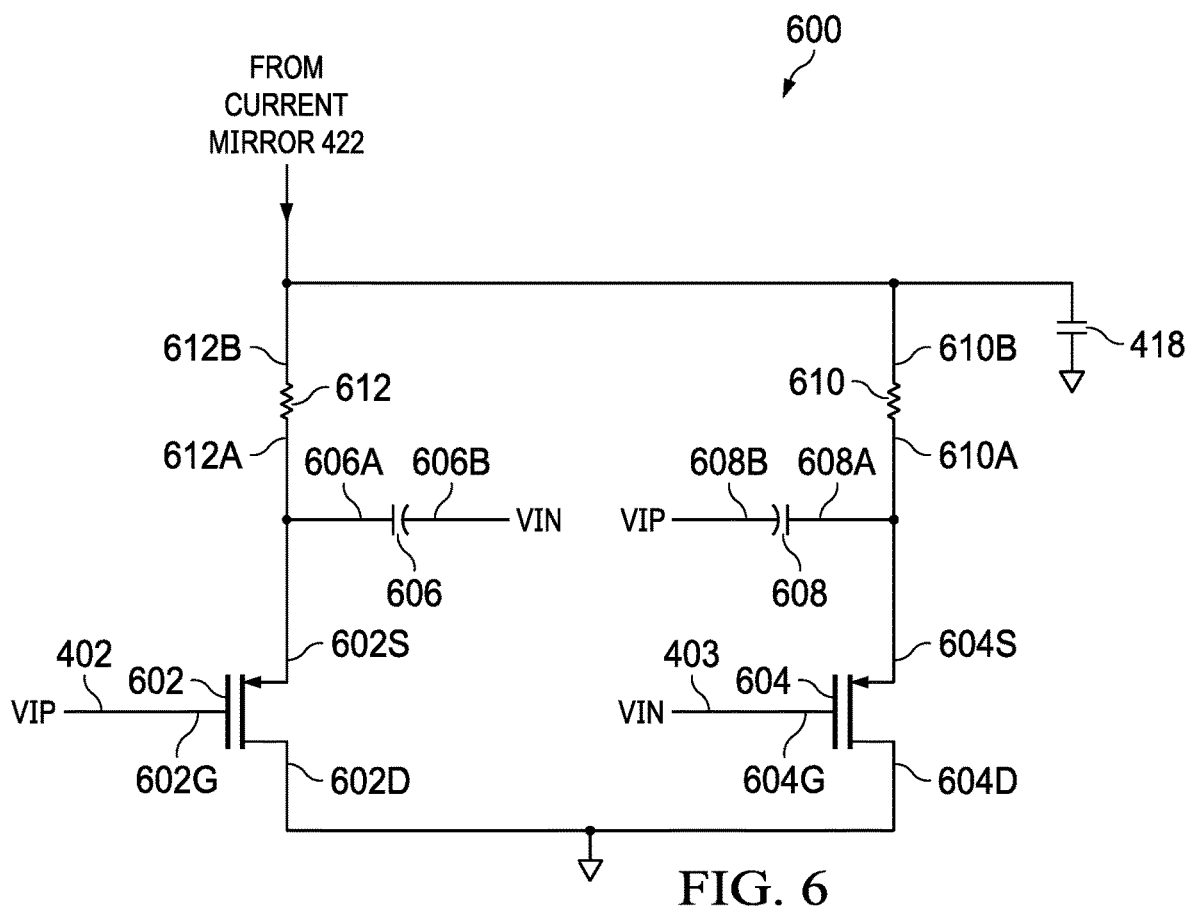
FIG. 6 shows a schematic diagram for an example rectifier circuit for use in a signal detection circuit with a differential input signal in accordance with this description.

FIG. 6 shows a schematic diagram for an example rectifier circuit 600 for use in a signal detection circuit with a differential input signal in accordance with this description. The rectifier circuit 600 is suitable for use in the signal detection circuit 400 or the signal detection circuit 500 in place of the rectifier circuit 404. The rectifier circuit 600 includes the signal input terminal 402, a signal input terminal 403, a signal input transistor 604, a signal input transistor 603, a capacitor 606, a capacitor 608, a resistor 610, a resistor 612, and the capacitor 418. The signal input transistor 602 and the signal input transistor 604 respectively receive the positive and negative signals of the differential input signal.

The gate terminal 602G of the signal input transistor 602 is coupled to the signal input terminal 402. The drain terminal 602D of the signal input transistor 602 is coupled to the reference voltage source. The source terminal 602S of the signal input transistor 602 is coupled to terminal 612A of the resistor 612. Terminal 612B of the resistor 612 is coupled to the capacitor 418. The gate terminal 604G of the signal input transistor 604 is coupled to the signal input terminal 403. The drain terminal 604D of the signal input transistor 604 is coupled to the reference voltage source. The source terminal 604S of the signal input transistor 604 is coupled to terminal 610A of the resistor 610. Terminal 610G of the resistor 610 is coupled to the capacitor 418.

The capacitors 606 and 608 are cross-coupled with respect to the signal input transistors 602 and 604. The terminal 606A of the capacitor 606 is coupled to the source terminal 602S of the signal input transistor 602, and the terminal 606B of the capacitor 606 is coupled to the signal input terminal 403. The terminal 608A of the capacitor 608 is coupled to the source terminal 604S of the signal input transistor 604, and the terminal 608B of the capacitor 608 is coupled to the signal input terminal 402. The capacitance of the capacitor 606 and the capacitor 608 is at least twice the gate-source capacitance of the signal input transistor 602 or the signal input transistor 604 in some implementations of the rectifier circuit 600. Inclusion of the capacitor 606 and the capacitor 608 increases the gain of the rectifier circuit 600, relative to the signal detection circuit 400 or the signal detection circuit 500, by at least a factor of two.

Figure 7:
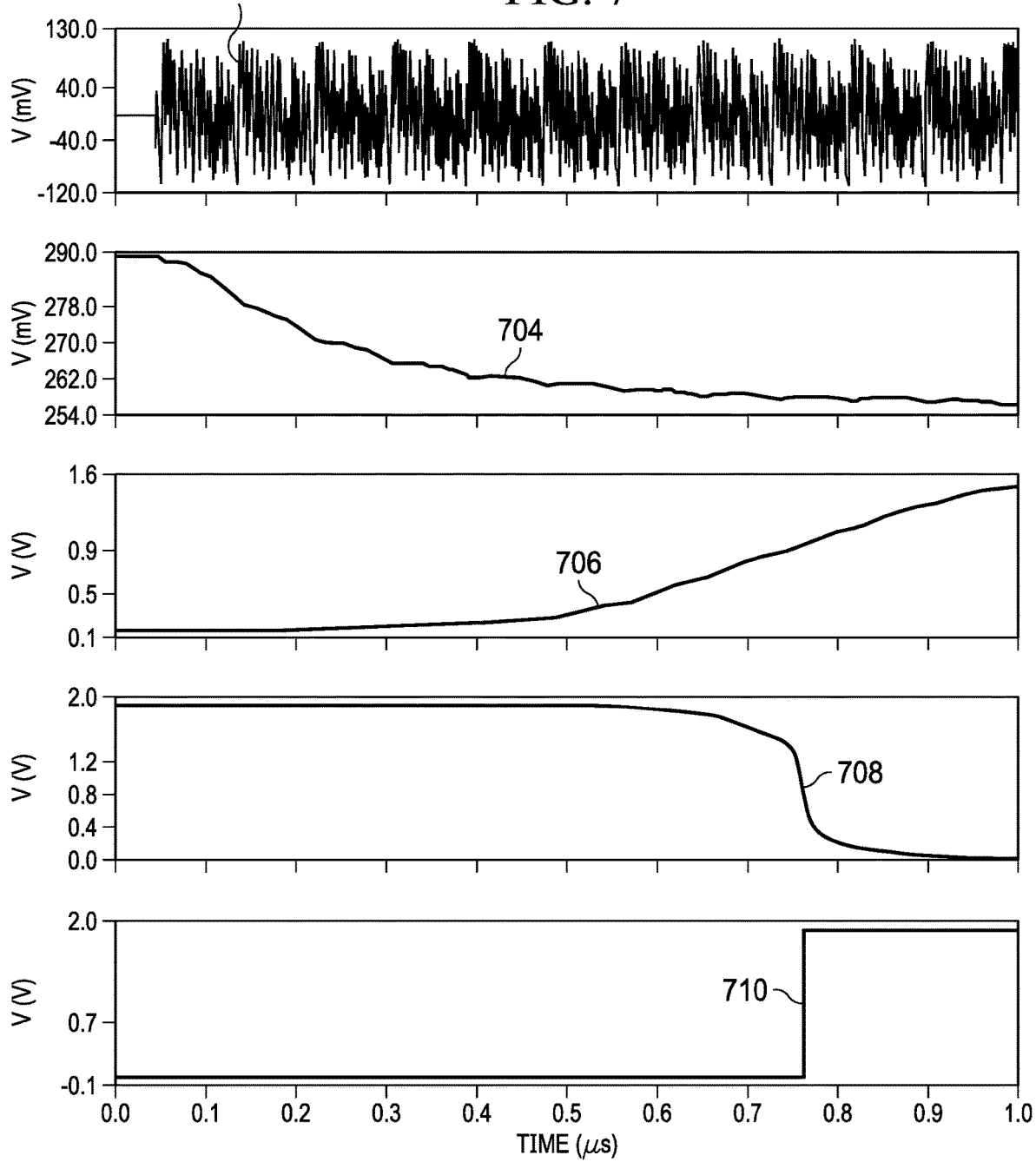
FIGS. 7 and 8 show signals in a signal detection circuit in accordance with this description.
Figure 8:
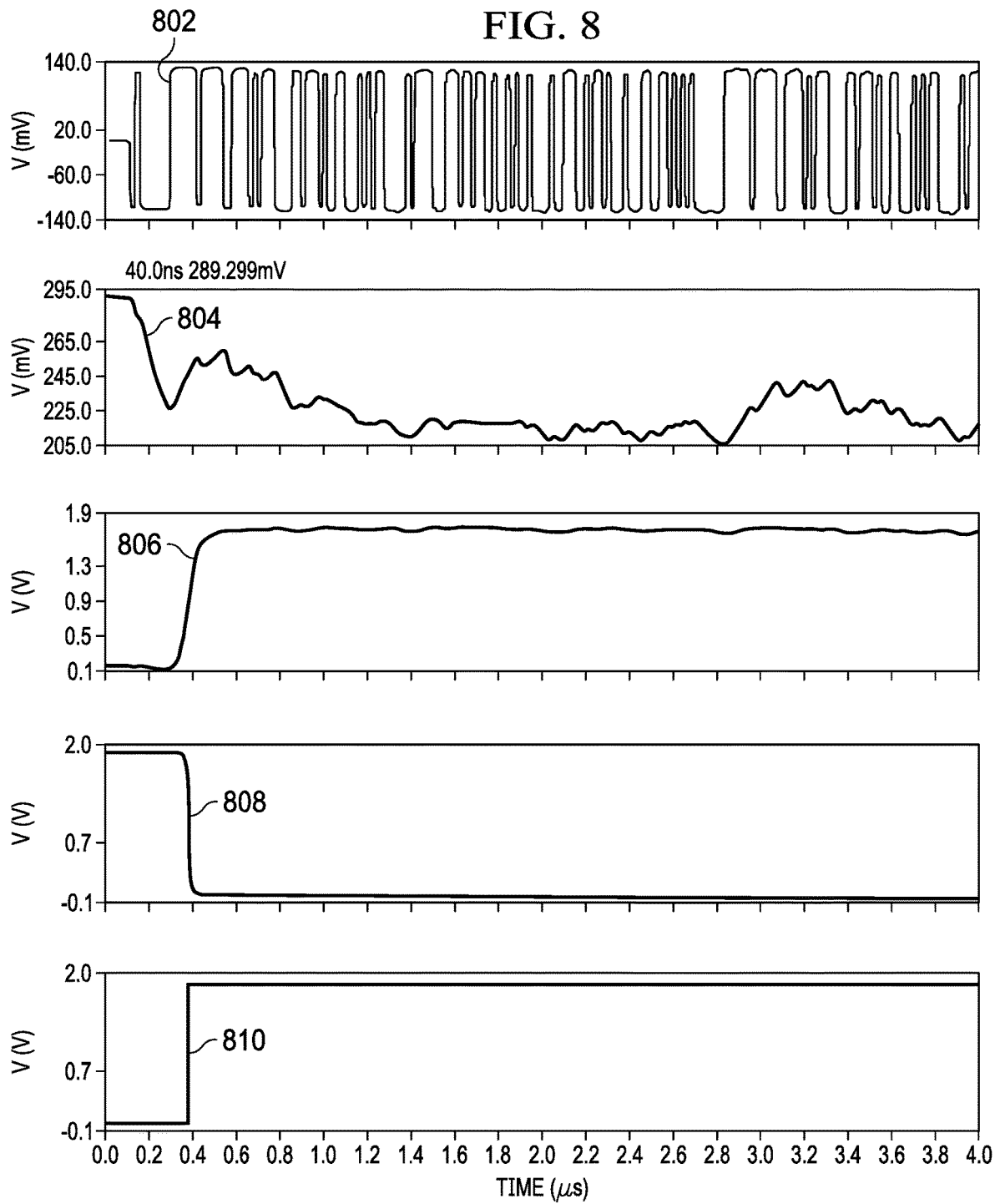

FIGS. 7 and 8 show signals in a signal detection circuit in accordance with this description. FIG. 7 shows operation of an implementation of the signal detection circuit 400 detecting a 1.5 gigabit per second input signal 702 at the signal input terminal 402. The voltage 704 generated by the rectifier circuit 404 (i.e., the voltage across the capacitor 432) decreases as energy of the input signal 702 is accumulated. Responsive to the decreasing voltage 704, the comparator output voltage 706 (voltage at the comparator output terminal 412) increases and the inverter 414 changes state at 708 to indicate detection of the input signal 702. Some implementations of the signal detection circuit 400 include inverter with hysteresis coupled to the inverter 414, which changes state at 710 responsive to the transition at 708.

FIG. 8 shows operation of an implementation of the signal detection circuit 400 detecting a 50 megabit per second input signal 802 at the signal input terminal 402. The voltage 804 generated by the rectifier circuit 404 (i.e., the voltage across the capacitor 432) decreases as energy of the input signal 802 is accumulated. Responsive to the decreasing voltage 802, the comparator output voltage 806 (voltage at the comparator output terminal 412) increases and the inverter 414 changes state at 808 to indicate detection of the input signal 802. Some implementations of the signal detection circuit 400 include inverter with hysteresis coupled to the inverter 414, which changes state at 810 responsive to the transition at 808.

Modifications are possible in the described embodiments, and other embodiments are possible, within the scope of the claims.

What is claimed is:

1. A signal detection circuit, comprising:
a signal input terminal;
a common mode input terminal;
a comparator output terminal;
a signal input transistor, comprising:
  a first terminal coupled to the signal input terminal; and
  a second terminal coupled to a reference voltage source;
a resistor comprising a first terminal coupled to a third terminal of the signal input transistor;
a capacitor comprising:
  a first terminal coupled to the first terminal of the resistor; and
  a second terminal coupled to the reference voltage source;
a common mode input transistor, comprising:
  a first terminal coupled to the common mode input terminal; and
  a second terminal coupled to the reference voltage source;
a current mirror circuit, comprising:
  a first transistor comprising:
    a first terminal coupled to a second terminal of the resistor; and
    a second terminal coupled to a third terminal of the first transistor; and
  a second transistor comprising:
    a first terminal coupled to a third terminal of the common mode input transistor; and
    a second terminal coupled to the second terminal of the first transistor; and
a current source, comprising:
  a transistor comprising:
    a first terminal coupled to a power rail; and
    a second terminal coupled to a third terminal of the second transistor of the current mirror circuit and the comparator output terminal.

2. The signal detection circuit of claim 1, wherein:
the current mirror circuit is a first current mirror circuit; and
the signal detection circuit further comprises:
  a second current mirror circuit comprising:
    a first transistor comprising:
      a first terminal coupled to a third terminal of the first transistor of the first current mirror circuit; and
      a second terminal coupled to a third terminal of the first transistor of the second current mirror circuit; and
    a second transistor comprising:
      a first terminal coupled to the third terminal of the second transistor of the first current mirror circuit;
      a second terminal coupled to the second terminal of the first transistor of the second current mirror circuit; and
      a third terminal coupled to the comparator output terminal.

3. The signal detection circuit of claim 1, wherein:
the capacitor is a first capacitor; and
the signal detection circuit further comprises:
  a second capacitor comprising:
    a first terminal coupled to second terminal of the first transistor of the current mirror circuit; and
    a second terminal coupled to the reference voltage source.

4. The signal detection circuit of claim 1, further comprising an inverter comprising an input terminal coupled to the comparator output terminal.

5. The signal detection circuit of claim 1, wherein:
the resistor is a first resistor; and
the signal detection circuit further comprises:
  a second resistor comprising:
    a first terminal coupled to the third terminal of the common mode input transistor; and
    a second terminal coupled to the first terminal of the second transistor of the current mirror circuit.

6. The signal detection circuit of claim 1, wherein:
the signal input transistor is a first signal input transistor;
the resistor is a first resistor;
the signal input terminal is a first signal input terminal; and
the signal detection circuit further comprises:
  a second signal input terminal;
  a second signal input transistor comprising:
    a first terminal coupled to the second signal input terminal; and
    a second terminal coupled to the reference voltage source; and
  a second resistor comprising:
    a first terminal coupled to a third terminal of the second signal input transistor; and
    a second terminal coupled to the first terminal of the capacitor.

7. The signal detection circuit of claim 6, further comprising:
a second capacitor comprising:
  a first terminal coupled to the first signal input terminal; and
  a second terminal coupled to the third terminal of the second signal input transistor; and
a third capacitor comprising:
  a first terminal coupled to the second signal input terminal; and a second terminal coupled to the third terminal of the first signal input transistor.

8. The signal detection circuit of claim 1, wherein:
the current source is first current source; and
the signal detection circuit further comprises:
  a second current source, comprising:
    a transistor comprising:
      a first terminal coupled to the power rail; and
      a second terminal coupled to a third terminal of the first transistor of the current mirror circuit.

9. A signal detection circuit, comprising:
a signal input terminal;
a rectifier circuit coupled to the signal input terminal, and configured to:
  receive an input signal; and
  generate a rectified signal based on the input signal;
a comparator circuit coupled to the rectifier circuit, and configured to:
  receive a common mode signal; and
  generate a difference current based on a difference of the common mode signal and the rectified signal;
a current source coupled to the comparator circuit, and configured to generate a reference current; and
a comparator output terminal configured to provide an output signal based on a difference of the reference current and the difference current.

10. The signal detection circuit of claim 9, wherein the comparator circuit is configured to generate a difference voltage of the common mode signal and the rectified signal.

11. The signal detection circuit of claim 9, further comprising a current mirror circuit configured to provide to the comparator circuit a current based on the rectified signal.

12. The signal detection circuit of claim 9, wherein the rectifier circuit comprises:
a signal input transistor coupled to the signal input terminal, and configured to receive the input signal;
a capacitor coupled to the signal input transistor; and
a resistor coupled to the signal input transistor.

13. The signal detection circuit of claim 12, further comprising a current mirror circuit coupled to the resistor and configured to provide to the comparator circuit a current based on the rectified signal.

14. The signal detection circuit of claim 13, wherein:
the current mirror circuit is a first current mirror circuit;
the current is a first current; and
the signal detection circuit further comprises a second current mirror circuit coupled to the first current mirror circuit, and configured to provide to the comparator circuit a second current based on the rectified signal.

15. The signal detection circuit of claim 12, wherein:
the signal input terminal is a first signal input terminal;
the signal input transistor is a first signal input transistor;
the resistor is a first resistor;
the input signal is a first input signal; and
the rectifier circuit further comprises:
  a second signal input terminal;
  a second signal input transistor coupled to the second signal input terminal, and configured to receive a second input signal; and
  a second resistor coupled to the second signal input transistor and the capacitor.

16. The signal detection circuit of claim 15, wherein:
the capacitor is a first capacitor; and
the signal detection circuit further comprises:
  a second capacitor coupled to the first signal input terminal and the second signal input transistor; and
  a third capacitor coupled to the second signal input terminal and the first signal input transistor.

17. A communication circuit, comprising:
a wake-up circuit configured to monitor a communication medium for signals, and comprising:
  a signal detection circuit, comprising:
    a signal input terminal;
    a common mode input terminal;
    a comparator output terminal;
    a signal input transistor, comprising:
      a first terminal coupled to the signal input terminal; and
      a second terminal coupled to a reference voltage source;
    a resistor comprising a first terminal coupled to a third terminal of the signal input transistor;
    a capacitor comprising:
      a first terminal coupled to the first terminal of the resistor; and
      a second terminal coupled to the reference voltage source;
    a common mode input transistor, comprising:
      a first terminal coupled to the common mode input terminal; and
      a second terminal coupled to the reference voltage source;
    a first current mirror circuit, comprising:
      a first transistor comprising:
        a first terminal coupled to a second terminal of the resistor; and
        a second terminal coupled to a third terminal of the first transistor; and
      a second transistor comprising:
        a first terminal coupled to a third terminal of the common mode input transistor; and
        a second terminal coupled to the second terminal of the first transistor;
    a second current mirror circuit, comprising:
      a first transistor comprising:
        a first terminal coupled to the second terminal of the first transistor of the first current mirror circuit; and
        a second terminal coupled to a third terminal of the first transistor of the second current mirror circuit; and
      a second transistor comprising:
        a first terminal coupled to a third terminal of the second transistor of the first current mirror circuit; and
        a second terminal coupled to the second terminal of the first transistor of the second current mirror circuit; and
    a current source, comprising:
      a transistor comprising:
        a first terminal coupled to a power rail; and
        a second terminal coupled to a third terminal of the second transistor of the second current mirror circuit and the comparator output terminal.

18. The communication circuit of claim 17, wherein:
the signal input transistor is a first signal input transistor;
the resistor is a first resistor;
the signal input terminal is a first signal input terminal; and
the signal detection circuit further comprises:
  a second signal input terminal;

a second signal input transistor comprising:
  a first terminal coupled to the second signal input terminal; and
  a second terminal coupled to the reference voltage source; and
a second resistor comprising:
  a first terminal coupled to a third terminal of the second signal input transistor; and
  a second terminal coupled to the first terminal of the capacitor.

19. The communication circuit of claim 18, wherein:
the capacitor is a first capacitor; and
the signal detection circuit further comprises:
  a second capacitor comprising:
    a first terminal coupled to the first signal input terminal; and
    a second terminal coupled to the third terminal of the second signal input transistor; and
  a third capacitor comprising:
    a first terminal coupled to the second signal input terminal; and
    a second terminal coupled to the third terminal of the first signal input transistor.

20. The communication circuit of claim 17, wherein:
the current source is first current source; and
the signal detection circuit further comprises:
  a second current source, comprising:
    a transistor comprising:
      a first terminal coupled to the power rail; and
      a second terminal coupled to a third terminal of the first transistor of the second current mirror circuit.

\* \* \* \* \*